United States Patent
Zhu et al.

(10) Patent No.: US 8,969,164 B2
(45) Date of Patent: Mar. 3, 2015

(54) SEMICONDUCTOR STRUCTURE AND METHOD FOR MANUFACTURING THE SAME

(75) Inventors: Huilong Zhu, Poughkeepsie, NY (US); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/002,456

(22) PCT Filed: Mar. 23, 2012

(86) PCT No.: PCT/CN2012/072981
§ 371 (c)(1),
(2), (4) Date: Aug. 30, 2013

(87) PCT Pub. No.: WO2013/113184
PCT Pub. Date: Aug. 8, 2013

(65) Prior Publication Data
US 2013/0334569 A1      Dec. 19, 2013

(30) Foreign Application Priority Data
Feb. 1, 2012    (CN) .......................... 2012 1 0022557

(51) Int. Cl.
*H01L 21/336*    (2006.01)
*H01L 29/78*    (2006.01)
(Continued)

(52) U.S. Cl.
CPC ...... *H01L 29/7842* (2013.01); *H01L 29/66431* (2013.01); *H01L 29/0847* (2013.01);
(Continued)

(58) Field of Classification Search
CPC ............... H01L 21/823807; H01L 21/823412; H01L 21/823864; H01L 29/1083; H01L 29/7848; H01L 29/66636; H01L 29/41766; H01L 29/6662; H01L 29/66719; H01L 29/66734; H01L 29/78696; H01L 29/6653; H01L 29/66553; H01L 29/6656; H01L 29/66689

USPC .......... 438/218, 294, 411, 412, 422, 589, 595
See application file for complete search history.

(56) References Cited

U.S. PATENT DOCUMENTS 7,033,868 B2 *  4/2006  Nakamura et al. ............ 438/149
7,605,443 B2 * 10/2009  Ogura ........................... 257/522
(Continued)

FOREIGN PATENT DOCUMENTS

| CN | 101431101 A | 5/2009 |
| CN | 101604 705 A | 12/2009 |
| CN | 102110710 A | 6/2011 |

OTHER PUBLICATIONS

International Search Report Application No. PCT/CN2012/072981 dated Nov. 8, 2012.

*Primary Examiner* — Bac Au
(74) *Attorney, Agent, or Firm* — Leason Ellis LLP.

(57) ABSTRACT

A semiconductor structure comprises a substrate, a gate stack, a base area, and a source/drain region, wherein the gate stack is located on the base area, the source/drain region is located in the base area, and the base area is located on the substrate. A supporting isolated structure is provided between the base area and the substrate, wherein part of the supporting structure is connected to the substrate; a cavity is provided between the base area and the substrate, wherein the cavity is composed of the base area, the substrate and the supporting isolated structure. A stressed material layer is provided on both sides of the gate stack, the base area and the supporting isolated structure. Correspondingly, a method is provided for manufacturing such a semiconductor structure, which inhibits the short channel effect, reduces the parasitic capacitance and leakage current, and enhances the steepness of the source/drain region.

17 Claims, 12 Drawing Sheets

(51) Int. Cl.
*H01L 29/66* (2006.01)
*H01L 29/08* (2006.01)
*H01L 21/84* (2006.01)
*H01L 27/12* (2006.01)
*H01L 21/8234* (2006.01)
*H01L 29/51* (2006.01)

(52) U.S. Cl.
CPC ............ *H01L 21/84* (2013.01); *H01L 27/1203* (2013.01); *H01L 21/823412* (2013.01); *H01L 29/51* (2013.01)
USPC .......... 438/294; 438/218; 438/411; 438/412; 438/422; 438/589; 438/595

(56) References Cited

U.S. PATENT DOCUMENTS

| | | | |
|---|---|---|---|
| 7,956,416 B2 * | 6/2011 | Wells et al. | 257/347 |
| 7,994,010 B2 * | 8/2011 | Teo et al. | 438/285 |
| 8,319,310 B2 * | 11/2012 | Huang | 257/472 |
| 2005/0189589 A1 | 9/2005 | Zhu et al. | |
| 2005/0285193 A1 | 12/2005 | Lee et al. | |
| 2006/0076619 A1 * | 4/2006 | Wang et al. | 257/336 |
| 2007/0184601 A1 * | 8/2007 | Zhang et al. | 438/199 |
| 2008/0166847 A1 * | 7/2008 | Utomo et al. | 438/301 |
| 2009/0121235 A1 | 5/2009 | Kim et al. | |
| 2010/0219474 A1 * | 9/2010 | Kronholz et al. | 257/347 |
| 2012/0235213 A1 | 9/2012 | Yin et al. | |

* cited by examiner

SEMICONDUCTOR STRUCTURE AND METHOD FOR MANUFACTURING THE SAME

CROSS REFERENCE TO RELATED APPLICATION

This application is a national stage application, filed under 35 U.S.C. §371, of PCT Application No. PCT/CN2012/072981, filed on Mar. 23, 2012, entitled "SEMICONDUCTOR STRUCTURE AND METHOD FOR MANUFACTURING THE SAME", which claimed priority to Chinese Application No. 201210022557.6, filed on Feb. 1, 2012, all of which are hereby incorporated by reference in their entirety.

TECHNICAL FIELD

The present invention relates to a field of semiconductor technology. In particular, the present invention relates to a semiconductor structure and a method for manufacturing the same.

BACKGROUND OF THE ART

In industry, there is a need that ICs should have a higher density and thus the size of the MOS transistor should be reduced. Scaling of MOS transistors, however, leads to two well-known parasitic effects, i.e., short channel effect and drain-induced barrier lowering effect due to the decreased gate length, and tends to deteriorate the electrical properties of the device, such as dropped gate threshold voltage, increased power consumption and decreased signal to noise ratio. Physically, these effects can be explained as follows: when the transistor is turned off (i.e., when the gate voltage is zero), the static electricity in the source/drain regions of very small devices or the voltage applied to the drain in the channel region may reduce the energy barrier of the electrons or holes in the channel, and may result in a higher turn-off current.

In order to control the short channel effect, more dopants such as phosphorus and boron have to be doped into the channel, which may possibly lead to decrease of carrier mobility in the device channel. In addition, it is also difficult to control the steepness of the doping profile of dopants in the channel, and may cause a serious short-channel effect. Moreover, the thickness of the gate oxide dielectric will also become a development bottleneck, and the speed at which the gate oxide thickness decreases is difficult to catch up with the decrease in the gate width. As a result, gate dielectric leakage becomes bigger and bigger. Continuous decrease of the critical dimension may result in increased resistance of the source and drain regions and increased power consumption of the device.

Short channel effect can be effectively controlled through the strained silicon technology. Strained silicon has been used as a substrate of the MOS transistors, wherein lattice constant difference between silicon germanium and monocrystalline silicon results in the strain of the structure of silicon germanium epitaxial layer so that strained silicon is formed. The lattice constant of silicon germanium layer is greater than that of silicon, which causes the mechanical stress in the channel region and thus the change of carrier mobility. In FET, the tensile stress can increase the electron mobility and reduce the hole mobility, which advantageously improves the performance of NMOS; and compressive stress can enhance the hole mobility and reduce the electron mobility, which advantageously improves the performance of PMOS.

However, the conventional silicon-germanium strained silicon technology is also confronted with a bottleneck. It is difficult for the channel to provide a stronger strain, and therefore the performance of semiconductor devices cannot be effectively enhanced.

SUMMARY OF THE INVENTION

To solve the above-mentioned problems, the present invention provides a semiconductor structure and a method for manufacturing the same, so as to inhibit the short channel effect, reduce the parasitic capacitance and leakage current, enhance the steepness of the source/drain region, and provide a good stressing effect for the channel.

According to one aspect of the invention, a method for manufacturing a semiconductor structure is provided, in which the method comprises the following steps:

providing a substrate, forming a first semiconductor layer on the substrate, forming a second semiconductor layer on the first semiconductor layer and forming a gate stack on the second semiconductor layer;

removing the second semiconductor on both sides of the gate stack to form a first device stack;

forming a spacer on both sides of the first device stack, and removing part of the first semiconductor layer on both sides of the first device stack with a certain thickness of the first semiconductor layer left;

in a partial area of the first device stack along the width direction, removing the first semiconductor layer located on both sides of the first device stack to expose the substrate;

in the partial area of the first device stack along the width direction, forming a supporting isolated structure connected to the substrate under the spacer and under the edge on both sides of the first device stack;

removing the remaining first semiconductor layer to form a cavity under the first device stack; and removing the spacer and filling both sides of the first device stack with stressed materials to form a stressed material layer.

According to another aspect of the invention, a semiconductor structure, which comprises a substrate, a gate stack, a base area, and source/drain region, is provided wherein:

the gate stack is located on the base area, the source/drain region is located in the base area, and the base area is located on the substrate, a supporting isolated structure is provided between the base area and the substrate, wherein part of the supporting isolated structure is connected to the substrate;

a cavity is provided between the base area and the substrate, wherein the cavity is composed of the base area, the substrate and the supporting isolated structure; and a stressed material layer is provided on both sides of the gate stack, the base area and the supporting isolated structure.

The technical solutions according to the present invention will have the following advantages over the prior art. The channel with less thickness and the cavity formed between the channel and the substrate would be beneficial to inhibition of the short channel effect, reduction of the parasitic capacitance, reduction of the leakage current and enhancement of the steepness of the source/drain region. In addition, as the cavity is arranged below the channel, the stress of the stressed material layer on both sides of the channel will maximize the effect on the channel, so that the influence of the stress on the channel carrier mobility can be effectively improved, the control of the channel performance can be enhanced, and thereby the inhibition and the control of the short channel effect can be better realized.

DESCRIPTION OF THE DRAWINGS

Other characteristics, objectives and advantages will become more obvious after reading the detailed description of the non-limiting embodiments with reference to the following attached drawings, in which.

DETAILED DESCRIPTION OF THE INVENTION

Exemplary embodiments of the present disclosure will be described in more details.

Some embodiments are illustrated in the attached drawings, in which the same or similar reference numbers represent the same or similar elements or the components having the same or similar functions. The following embodiments described with reference to the drawings are only exemplary for explaining the present invention, and therefore shall not be construed as limiting the present invention. The disclosure below provides many different embodiments or examples to implement different structures of the present invention. In order to simplify the disclosure of the present invention, components and settings of specific examples are described below. Obviously, they are merely exemplary, and are not intended to limit the present invention. In addition, reference numbers and/or letters can be repeated in different examples of the invention. This repetition is used only for simplicity and clarity, and does not indicate any relationship between the discussed embodiments and/or settings. Furthermore, the invention provides a variety of specific examples of processes and materials, but it is obvious for a person of ordinary skill in the art that other processes can be applied and/or other materials can be used. In addition, the following description of a structure where a first feature is "on" a second feature can comprise examples where the first and second feature are in direct contact, and also can comprise examples where additional features are formed between the first and second features so that the first and second features may not be in direct contact.

Figure 12:
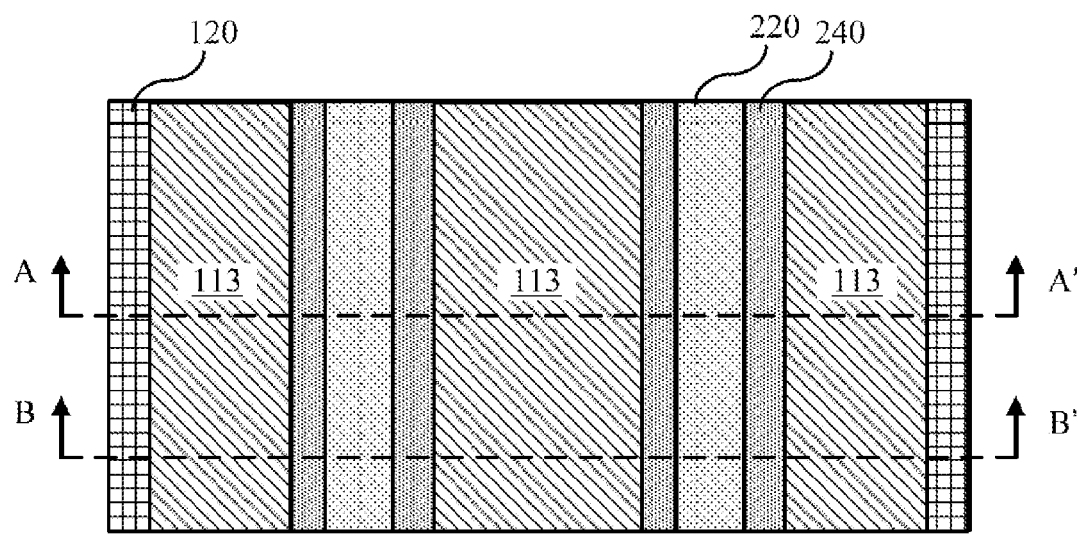
FIG. 12 is a schematic top after filling both sides of the gate stack with stressed materials.
Figure 12A:
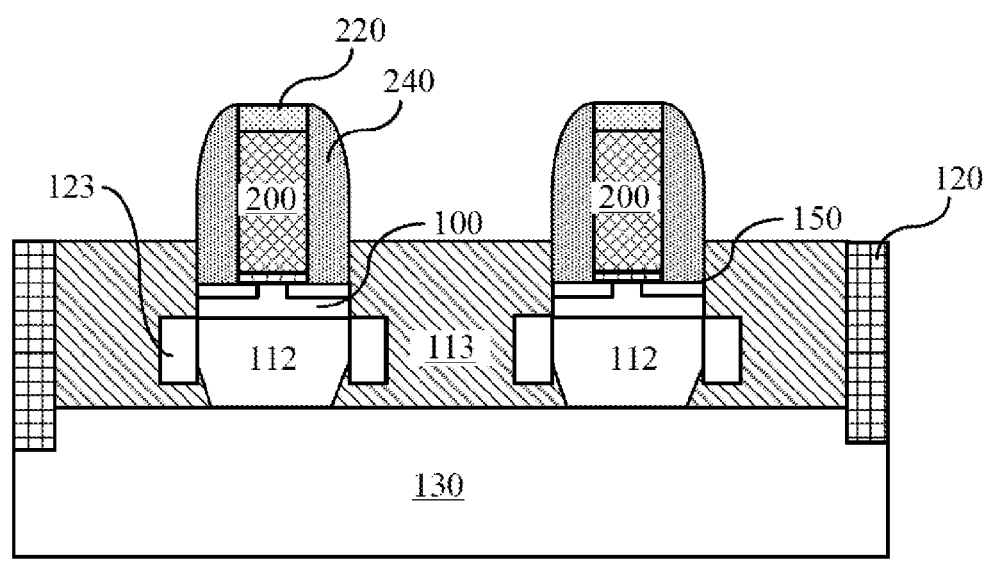
FIG. 12a and FIG. 12b are schematic cross-sectional views of FIG. 12 taken along lines AA' and BB', respectively.
Figure 12B:
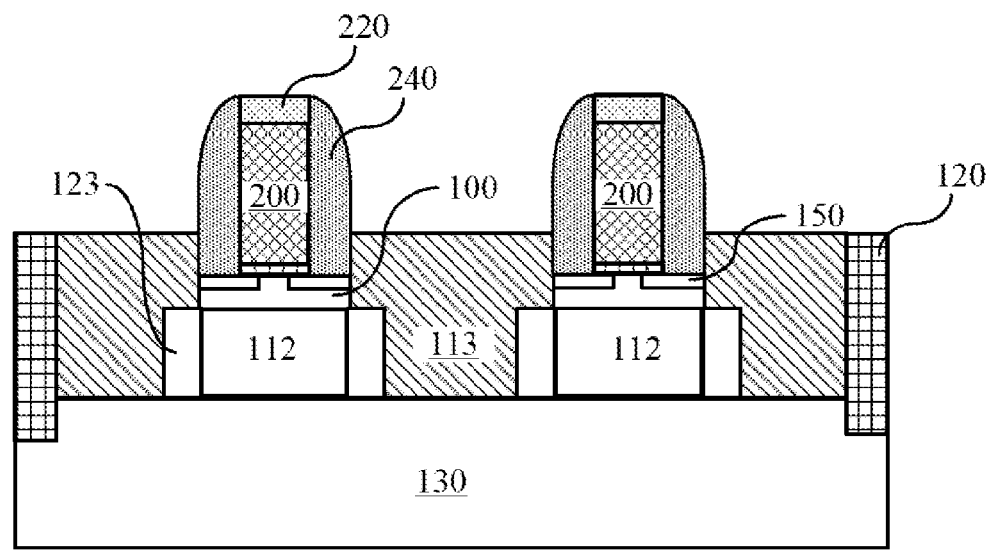

According to one aspect of the invention, a semiconductor structure is provided with reference to FIG. 12, FIG. 12a and FIG. 12b, wherein FIG. 12 is a schematic top view of the semiconductor structure, and FIG. 12a and FIG. 12b are schematic cross-sectional views of FIG. 12 taken along lines AA' and BB', respectively. As shown in the drawings, the semiconductor structure comprises a substrate 130, a gate stack, a base area 100 and a source/drain region 150, wherein the gate stack is provided on the base area 100, the source/drain region 150 is provided in the base area 100, and the base area 100 is provided on the substrate 130; a supporting isolated structure 123 is formed between the base area 100 and the substrate 130, wherein part of the supporting isolated structure 123 is connected to the substrate 130; a cavity 112 is formed between the base area 100 and the substrate 130, wherein the cavity 112 is constituted by the base area 100, the substrate 130 and the supporting isolated structure 123; and a stressed material layer 113 is formed on both sides of the gate stack, the base area 100 and the supporting isolated structure 123.

In particular, the material of the substrate 130 in the present embodiment can be monocrystalline Si; in other embodiments, the materials of the substrate 130 can be polycrystalline Si, polycrystalline Ge, polycrystalline SiGe, amophrous Si, amophrous Ge, amophrous SiGe, semiconductors of Group III-V or Group II-VI compounds, or any combination thereof. The substrate 130 has a thickness in the range between 0.1 nm and 2 mm.

The gate stack comprises a gate dielectric layer 102, a gate 200, a cap layer 220 and a spacer 240, wherein the gate dielectric layer 102 is provided on the base area 100, the gate 200 is provided on the gate dielectric layer 102, and the cap layer 220 is provide on the gate 200 to protect the gate 200 from being destroyed in subsequent steps. The spacer 240 surrounds the side surfaces of the gate dielectric layer 102, the gate 200 and the cap layer 220. The material for the gate 200 can be selected from a group consisting of Poly-Si, Ti, Co, Ni, Al, W, alloy, metal silicide, and any combination thereof. The gate dielectric layer 102 can be a thermal oxide layer comprising, but not limited to, silicon oxide, silicon oxynitride, and also can be a high-K dielectrics, for example, $HfO_2$, HfSiO, HfSiON, HfTaO, HfTiO, HfZrO, $Al_2O_3$, $La_2O_3$, $ZrO_2$ or LaAlO, or any combination thereof. The gate dielectric layer 220 can have a thickness of about 2 nm to 10 nm, for example, 5 nm or 8 nm. One or any combination of, for example, TaC, TiN, TaTbN, TaErN, TaYbN, TaSiN, HfSiN, MoSiN, RuTax or NiTa can be deposited. The cap layer 220 can be selected from nitrides of silicon, and have a thickness in the range between 10 nm to 40 nm, for example 10 nm or 20 nm. The material of the spacer 240 comprises one or any combination of silicon nitride, silicon oxide, silicon oxynitride, or silicon carbide, and/or can be formed from other suitable materials. The spacer 240 can have either a single-layer structure, or a multi-layer structure. The spacer 240 has a thickness in the range between 10 nm and 100 nm, for example, 30 nm, 50 nm or 80 nm.

The base area 100 is located below the gate stack, and the source/drain region 150 and the channel of the semiconductor structure are formed in the base area 100. In the present embodiment, the material of the base area 100 can be monocrystalline Si, while the material of the base area 100 in other embodiments can be other suitable semiconductor materials. The base area 100 has a thickness in the range between 10 nm and 30 nm.

The supporting isolated structure 123 is provide between the substrate 130 and the base area 100, with the purpose of suspending the gate stack and the base area 100 on the substrate 130, and forming a cavity 112 between the base area 100 and the substrate 130. Part of the supporting isolated structure 123 is connected to the substrate 130. In other words, part of the supporting isolated structure 123 is separated from the substrate 130 by a certain distance without direct contact. In the present embodiment, the supporting isolated structure 123 and the base area 100 can be made of the same material, such as monocrystalline Si. While in other embodiments, the material of the supporting isolated material 123 can be any other suitable semiconductor materials.

A stressed material layer 113 is formed on both sides of the gate stack, the base area 100 and the supporting isolated structure 123. The upper surface of the stressed material layer 113 is preferably higher than the bottom of the gate stack, or at the same level as the bottom of the gate stack. Herein, the material of the stressed material layer 113 is boron-doped $Si_{1-x}Ge_x$ with the value of X in a range of about 0.1 to 0.7, such as 0.2, 0.3, 0.4, 0.5 or 0.6. In the case of an NFET device, the material of the stressed material layer 113 is phosphorus- or arsenicum-doped Si:C with the atom percentage of C in the range of 0.2% to 2%, such as 0.5%, 1% or 1.5%. The existence of the stressed material layer 113 contributes to a further adjustment of the stress in the channel region, so that the carrier mobility in the channel region can be increased. Furthermore, due to the existence of the stressed material layer 113, an N-type super-steep retrograde well structure is provided for a PFET device, and a P-type super-steep retrograde well structure is provided for an NFET device.

The semiconductor structure according to the invention has the following advantages: the channel with less thickness and the cavity formed between the channel and the substrate would be beneficial to inhibition of the short channel effect, reduction of the parasitic capacitance, reduction of the leakage current and enhancement of the steepness of the source/drain region. In addition, as the cavity is arranged below the channel, the stress of the stressed material layer on both sides of the channel will maximize the effect on the channel, so that the influence of the stress on the channel carrier mobility can be effectively improved, the control of the channel performance can be enhanced, and thereby the inhibition and the control of the short channel effect can be better realized.

Figure 1:
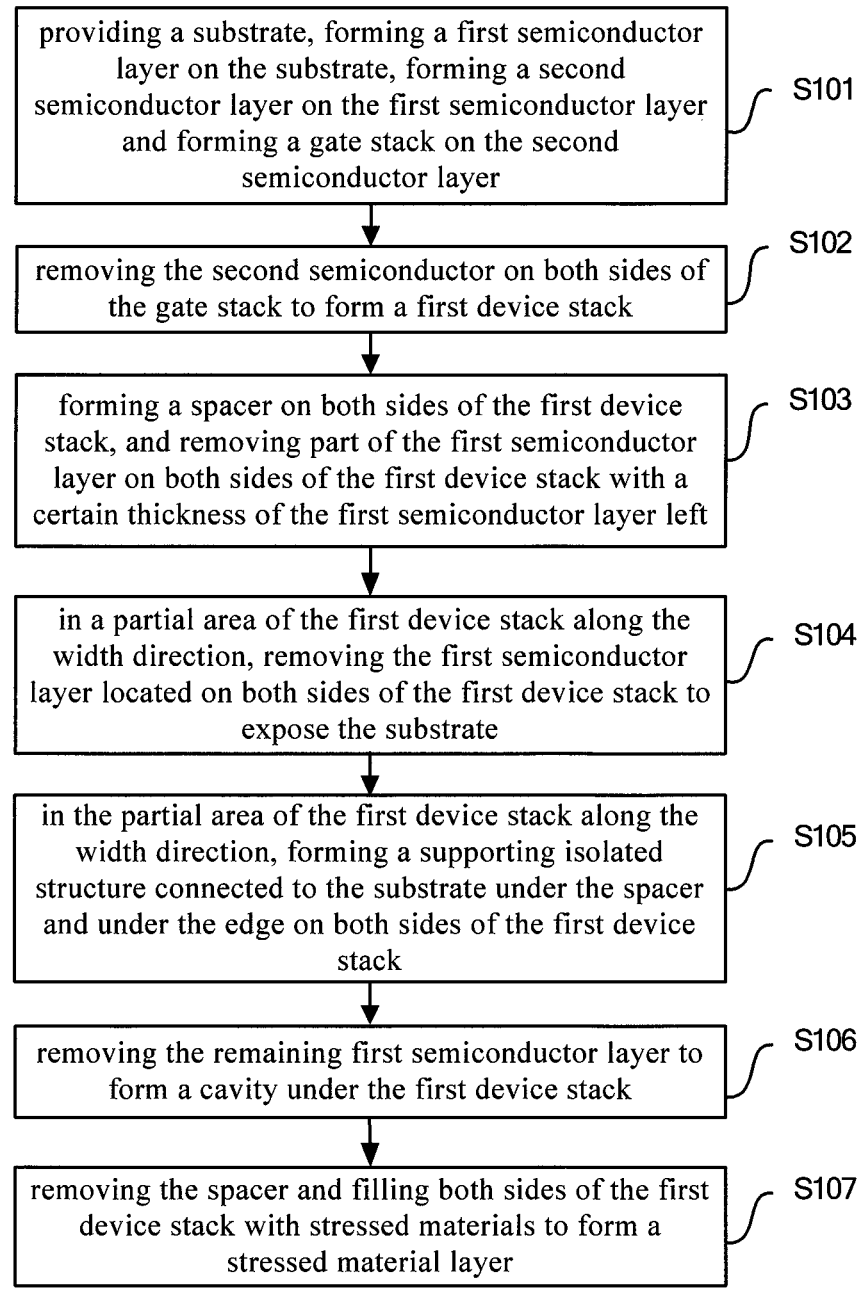
FIG. 1 is a schematic flow chart showing a method for manufacturing a semiconductor structure according to the invention.

According to another aspect of the invention, a method for manufacturing a semiconductor structure is provided. The method for manufacturing a semiconductor structure in FIG. 1 will be illustrated in more detail with reference to one embodiment according to the invention in combination with FIG. 2 to FIG. 12b. As shown in FIG. 1, the method for manufacturing the semiconductor structure according to the invention comprises the following steps.

In Step S101, a substrate 130 is provided, a first semiconductor layer 110 is first formed on the substrate 130, a second semiconductor layer 101 is then formed on the first semiconductor layer 110, and a gate stack is formed on the second semiconductor layer 101.

Figure 2:
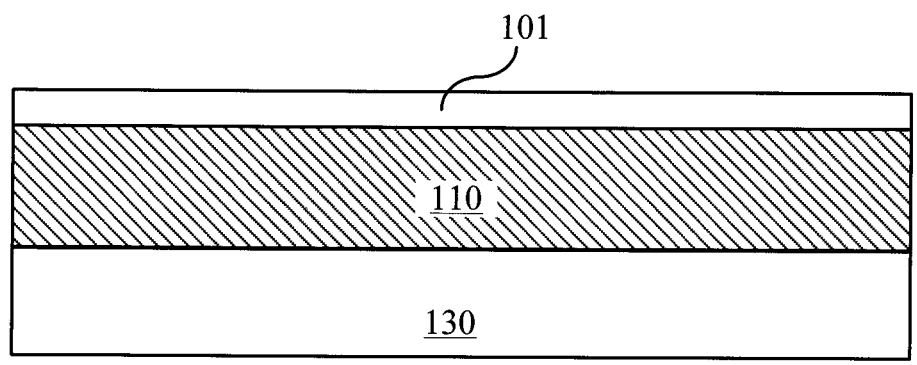
FIG. 2 is a schematic cross-sectional view after providing a substrate and forming a first semiconductor layer and a second semiconductor on the substrate.

In particular, as shown in FIG. 2, a substrate 130 is provided. In the present embodiment, the material of the substrate 130 is monocrystalline Si. In other embodiments, the material of the substrate 130 can be polycrystalline Si, polycrystalline Ge, polycrystalline SiGe, amophrous Si, amophrous Ge, amophrous SiGe, semiconductors of Group III-V or Group II-VI compounds, or any combination thereof. The substrate 130 has a thickness in the range between 0.1 nm and 2 mm.

The first semiconductor layer 110 is deposited on the substrate 130, wherein the material of the first semiconductor layer 110 is different from that of the substrate 130. In the present embodiment, the material of the first semiconductor layer 110 is preferably SiGe in which the proportion of Ge is 5% to 15%. The first semiconductor layer 110 has a thickness of 20 nm to 60 nm.

A thin second semiconductor layer 101 is deposited on the first semiconductor layer 110. In subsequent steps, the second semiconductor layer 101 will be used to form a channel region. In the present embodiment, the material of the second semiconductor layer 101 is monocrystalline silicon, and its thickness is 10 nm to 30 nm. In other embodiments, the material of the second semiconductor layer 101 can be a material different from that of the first semiconductor layer 110.

Figure 3:
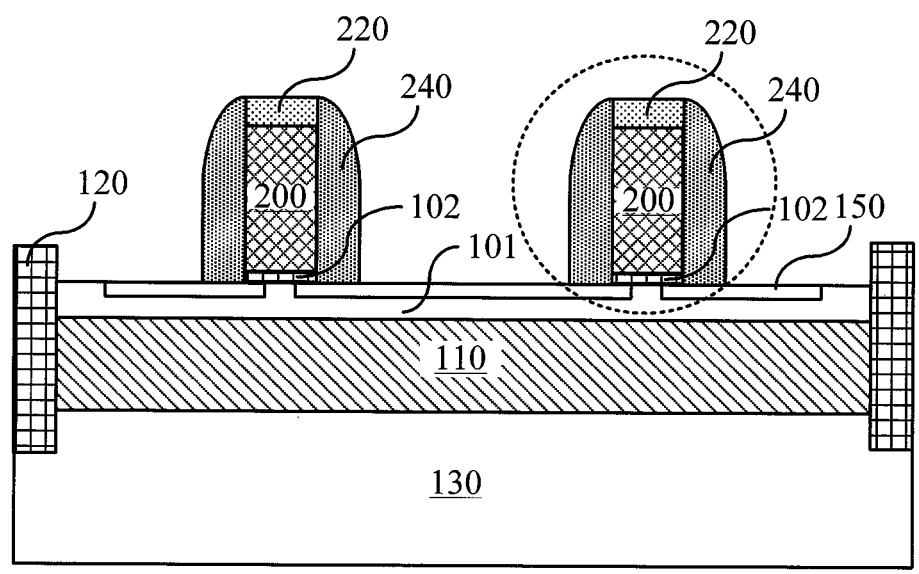
FIG. 3 is a schematic cross-sectional view after forming a gate stack.

Next, as shown in FIG. 3, an isolation region, such as a shallow trench isolation (STI) structure 120, is formed in the substrate 130, the first semiconductor layer 110 and the second semiconductor layer 101, so as to electrically isolate adjacent semiconductor devices.

Next, a gate dielectric layer 102, a gate 200, a cap layer 220 and a first spacer 240 are formed on the second semiconductor layer 101, wherein the gate dielectric layer 102 is provided on the second semiconductor layer 101, the gate 200 is provided on the gate dielectric layer 102, and the cap layer 220 is provided on the gate 200 to protect the gate 200 from being destroyed in subsequent steps. The surface of the second semiconductor layer 101 located on both sides of the gate 200 is lightly doped to form source/drain extension region. In case of a PFET device, the second semiconductor layer 101 is doped with P-type dopants, such as boron and indium; and in case of an NFET device, the second semiconductor layer 101 is doped with N-type dopants, such as arsenium and phosphorus. After the formation of the source/drain extension region, the first spacer 240 surrounding the side surfaces of the gate dielectric layer 102, the gate 200 and the cap layer 220 is formed, wherein the gate dielectric layer 102, the gate 200, the cap layer 220 and the first spacer 240 together constitute a gate stack (indicated by the area circled by the dashed line as shown in the figure). The method for forming the gate stack is a conventional semiconductor method, and will not be described herein. The material for the gate 200 can be selected from a group consisting of Poly-Si, Ti, Co, Ni, Al, W, alloy, metal silicide, and any combination thereof. The gate dielectric layer 102 can be a thermal oxide layer comprising, but not limited to, silicon oxide, silicon oxynitride, and also can be a high-K dielectric, for example, $HfO_2$, HfSiO, HfSiON, HfTaO, HfTiO, HfZrO, $Al_2O_3$, $La_2O_3$, $ZrO_2$ or LaAlO, or any combination thereof. The gate dielectric layer 102 can have a thickness of 2 nm to 10 nm, for example, 5 nm or 8 nm. The cap layer 220 can be formed by depositing one or any combination of, for example, Tab, TiN, TaTbN, TaErN, TaYbN, TaSiN, HfSiN, MoSiN, RuTax or NiTa. The cap layer 220 can be selected from nitrides of silicon, and have a thickness in the range between 10 nm to 40 nm, for example 10 nm or 20 nm. The material of the first spacer 240 comprises one or any combination of silicon nitride, silicon oxide, silicon oxynitride, or silicon carbide, and/or can be formed from other suitable materials. The spacer can have either a single-layer structure, or a multi-layer structure. The first spacer 240 has a thickness in the range between 10 nm and 100 nm, for example, 30 nm, 50 nm or 80 nm. After formation of the gate stack, the surface of the second semiconductor layer 101 is heavily doped to form a source/drain region (the source/drain region and the source/drain extension region are represented by the reference number 150 in the figures). In case of a PFET device, the second semiconductor layer 101 is doped with P-type dopants, such as boron and indium; and in case of an NFET device, the second semiconductor layer 101 is doped with N-type dopants, such as arsenium and phosphorus.

In Step S102, the semiconductor layer 101 located on both sides of the gate stack is removed to form the first device stack.

Figure 4:
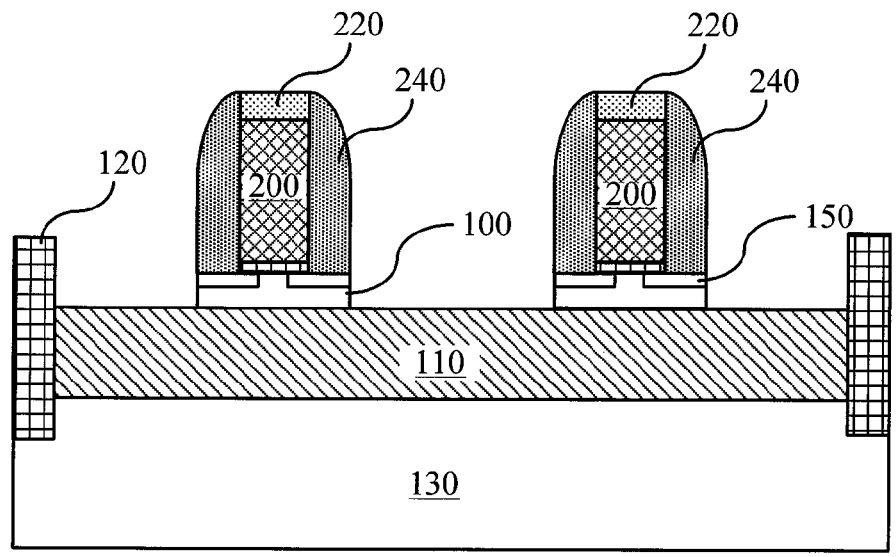
FIG. 4 is a schematic cross-sectional view after removing the second semiconductor layer on both sides of the gate stack.

In particular, as shown in FIG. 4, the second semiconductor layer 101 is removed by etching with the gate stack used as a mask and the first semiconductor layer 101 used as an etch stop layer, and a first base area 100 below the gate stack is kept, so that a first device stack is formed, wherein the etching process is preferably dry etching process which comprises plasma etching, ion beam milling, re-sputtering, and reactive ion etching. In the present embodiment, reactive ion etching is used. The first device stack comprises the first base area 100 and the gate stack thereon.

In Step S103, a spacer 260 is formed on both sides of the first device stack, and part of the first semiconductor layer 110 located on both sides of the first device stack is removed with a certain thickness of the first semiconductor layer 110 left.

Figure 5:
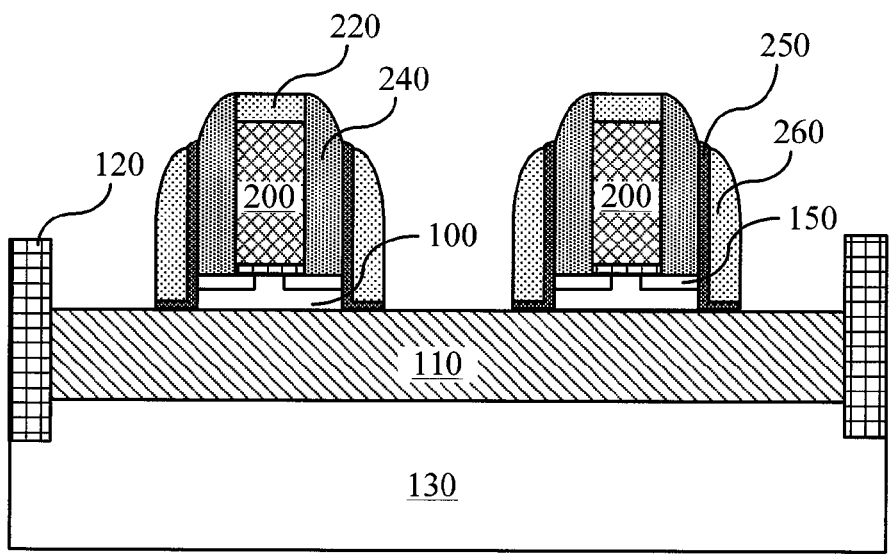
FIG. 5 is a schematic cross-sectional view after forming the stop layer and the second spacer on the side surfaces of the first spacer and the base area.

In particular, as shown in FIG. 5, a stop layer 250 is formed on the side surfaces of the first spacer 240 and the base area 100, and the spacer 260 (referred to as the second spacer 260 hereinafter) is formed on the side surface of the stop layer 250, wherein the material of the second spacer 260 comprises one or any combination of silicon nitride, silicon oxide, silicon oxynitride, or silicon carbide, and/or any other suitable materials. The second spacer 260 has a thickness in the range between 5 nm and 10 nm. The material of the stop layer 250 is preferably different from the insulation materials of the first spacer 240 and the second spacer 260. For example, the materials of the first spacer 240 and the second spacer 260 are silicon nitride, while the material of the stop layer 250 is silicon oxide. The stop layer 250 has a thickness in the range between 1 nm and 3 nm.

Figure 6:
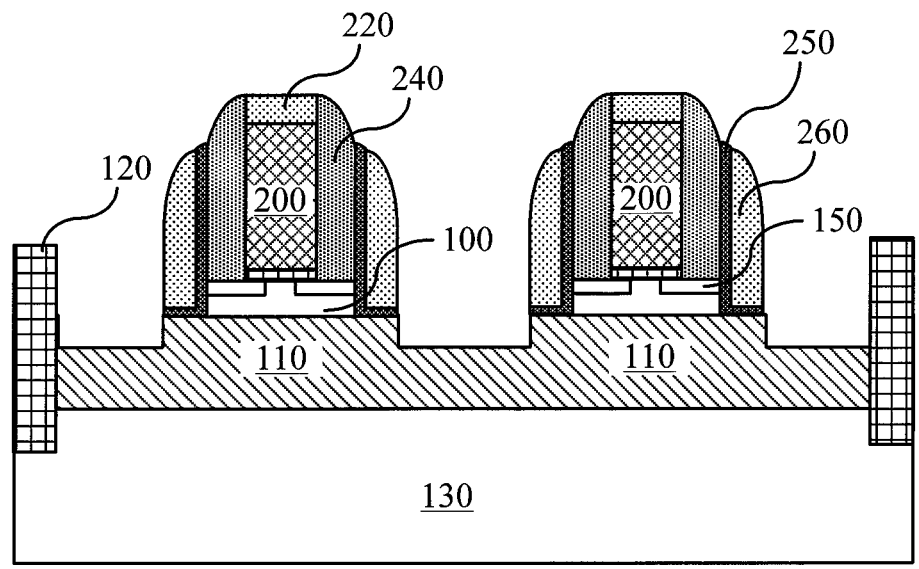
FIG. 6 is a schematic cross-sectional view after etching part of the first semiconductor layer.

Next, as shown in FIG. 6, the first semiconductor layer 110 located on both sides of the second spacer 260 is etched with the first device stack having the second spacer 260 used as a mask, for example, by using dry etching. During the etching process, the first semiconductor layer 110 having a certain thickness remains on both sides of the second spacer 260, instead of completely removing the first semiconductor layer 110.

In Step S104, in the partial area of the first device stack along the width direction, part of the first semiconductor layer 110 located on both sides of the first device stack is removed to expose the substrate 130.

Figure 7:
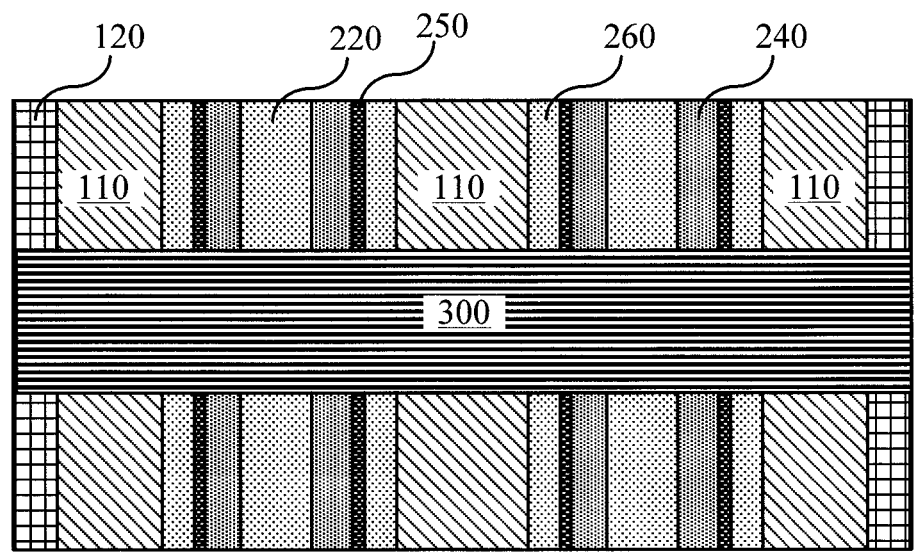
FIG. 7 is a schematic top view after covering a photoresist layer.

In particular, in the present embodiment, as shown in FIG. 7, a lithography mask 300 is formed on the semiconductor structure to cover the middle part and expose the end area of the semiconductor structure along the width direction, so that the first semiconductor layer 110 under the lithography mask 300 will not be etched away in subsequent steps. The material of the lithography mask 300 can be photoresist, organic polymer, silicon oxide, silicon nitride, borosilicate glass, boron-phosphorosilicate glass, or any combination thereof. The processes for forming the lithography mask 300 are familiar to those skilled in the art. For simplicity, such processes will not be described herein. The lithography mask 300 may protect the middle part of the first semiconductor layer 110 on both sides of the gate stack along the width direction of the semiconductor structure. That is to say, after etching the first semiconductor layer 110 which is not covered by the lithography mask 300 in subsequent steps, part of the first semiconductor layer 110 are kept on both sides of the gate stack in the middle along the width direction of the semiconductor structure. As explained below, the position of the lithography mask 300 is not limited to the position as shown in FIG. 7. Any lithography mask 300 that can cover the first semiconductor layer 110 located on both sides of the first device stack in the partial area of the semiconductor structure along the width direction is suitable for use in the method according to the invention. The specific examples thereof will not be given in detail.

Figure 8:
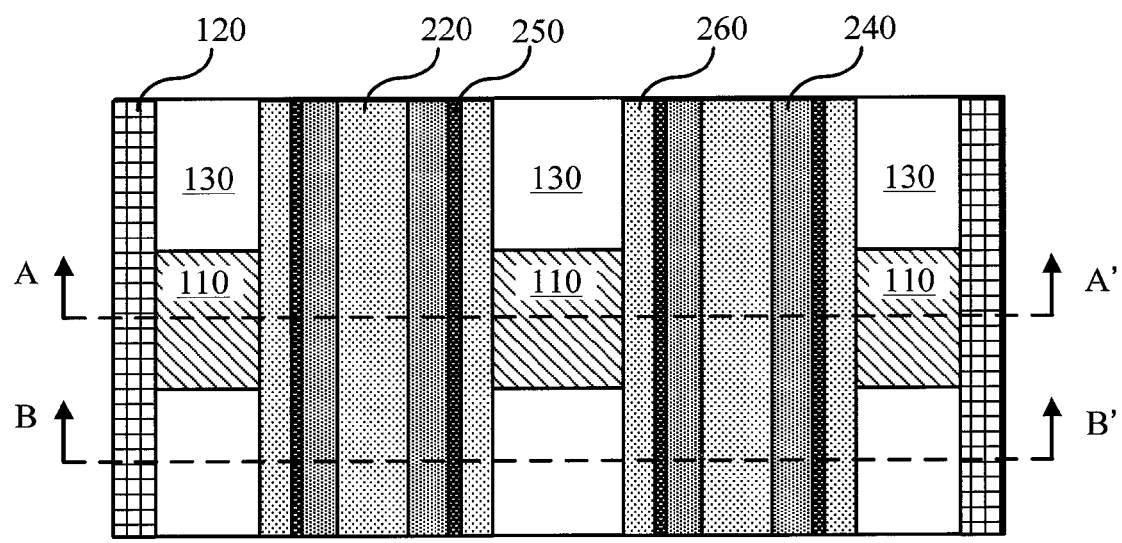
FIG. 8 is a schematic top view after etching the first semiconductor layer to expose part of the substrate.
Figure 8A:
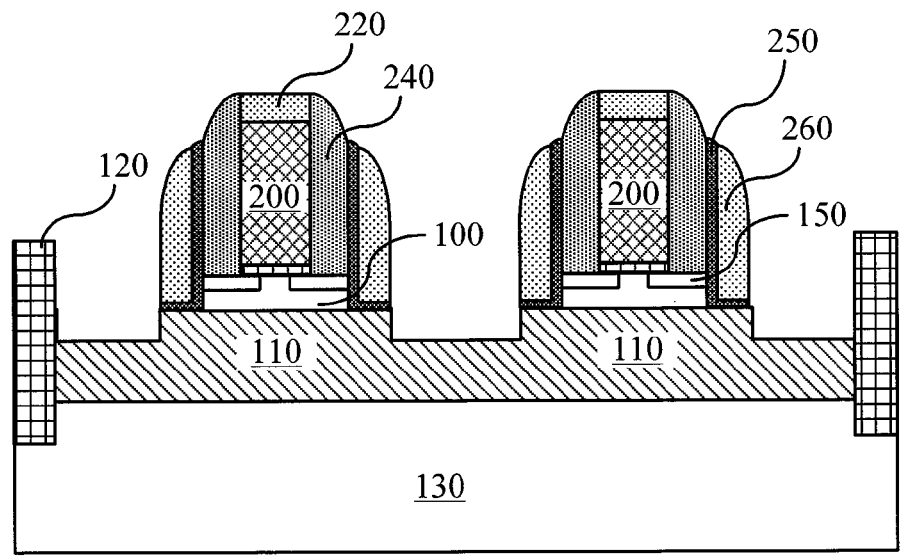
FIG. 8a and FIG. 8b are schematic cross-sectional views of FIG. 8 taken along lines AA' and BB', respectively.
Figure 8B:
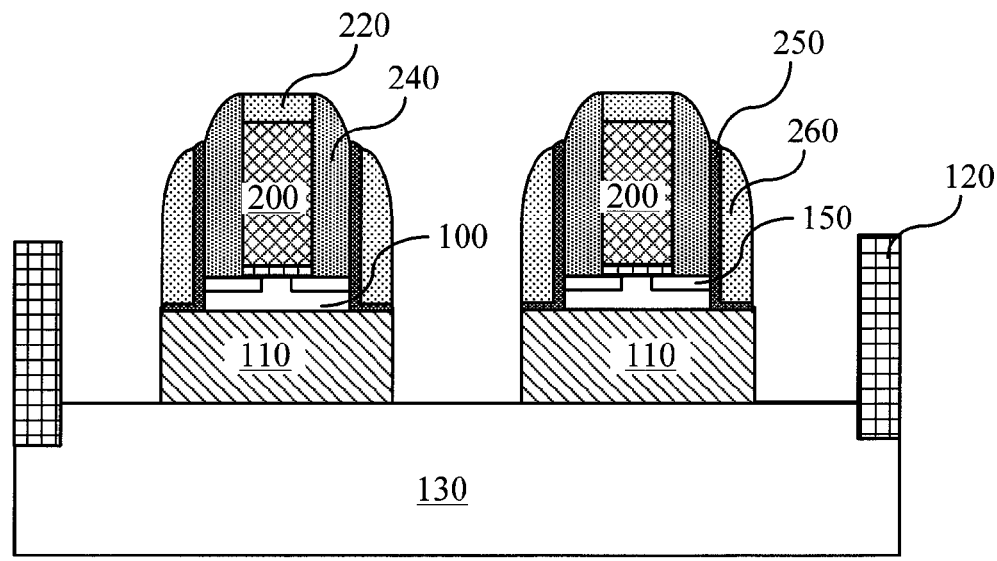

As shown in FIG. 8, in the two end areas of the first device stack along the width direction (in other embodiments, in the area that is not covered by the lithography mask 300 along the width direction of the first device stack), the first semiconductor layer 110 located outside the gate stack and the second spacer 260 is etched to expose the substrate 130, with the lithography 300 and the first device stack having the second spacer 260 as a mask, and the substrate 130 as a stop layer. Next, the lithography mask 300 is removed. Referring to FIG. 8a and FIG. 8b, which are schematic cross-sectional views of FIG. 8 taken along lines AA' and BB', respectively, as shown in FIG. 8a, in the middle part of the semiconductor structure along the width direction, the first semiconductor layer 110 located on both sides of the second spacer 260 and not covered by the lithography mask 300 can be kept, while in the two end areas of the semiconductor structure along the width direction, the second semiconductor layer 110 located on both sides of the spacer 260 and not covered by the lithography mask 300 is removed to expose the substrate 130 below, as shown in FIG. 8b.

In Step S105, in the partial area of the first device stack along the width direction, a supporting isolated structure 123 connected to the substrate is formed below both sides of the spacer 260 and the first device stack.

Figure 9:
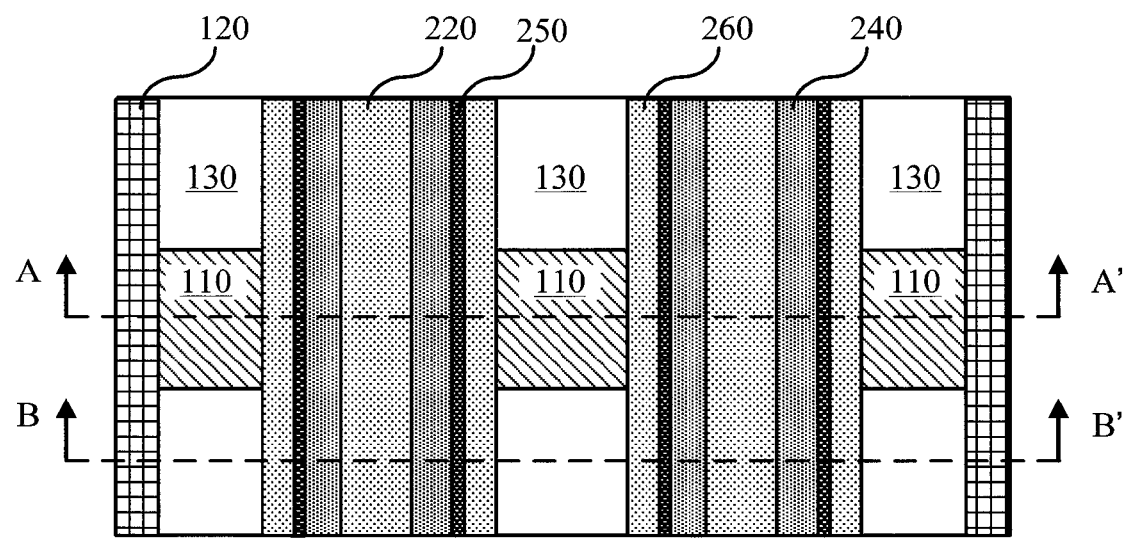
FIG. 9 is a schematic top view after selectively etching the second semiconductor layer laterally.
Figure 9A:
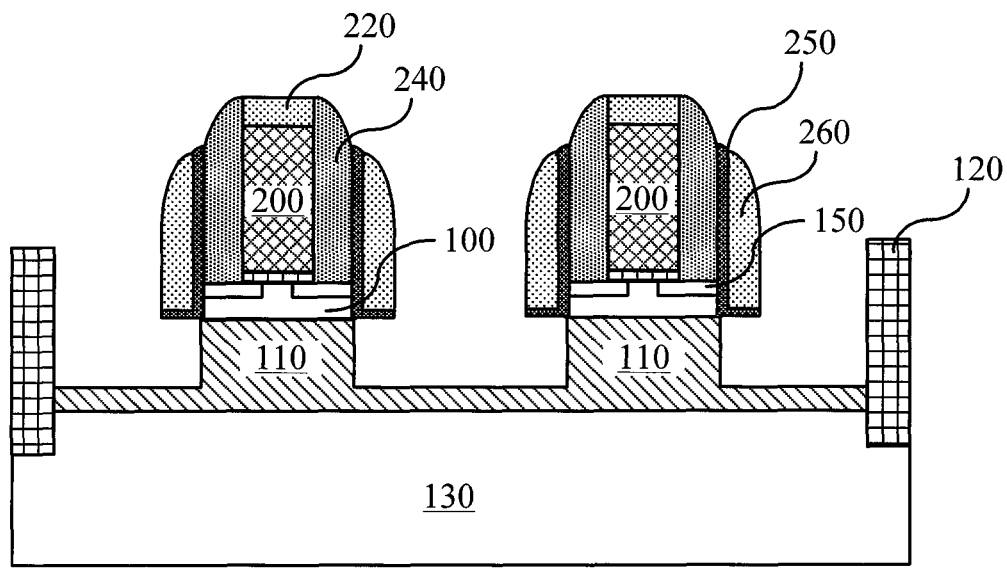
FIG. 9a and FIG. 9b are schematic cross-sectional views of FIG. 9 taken along lines AA' and BB', respectively.
Figure 9B:
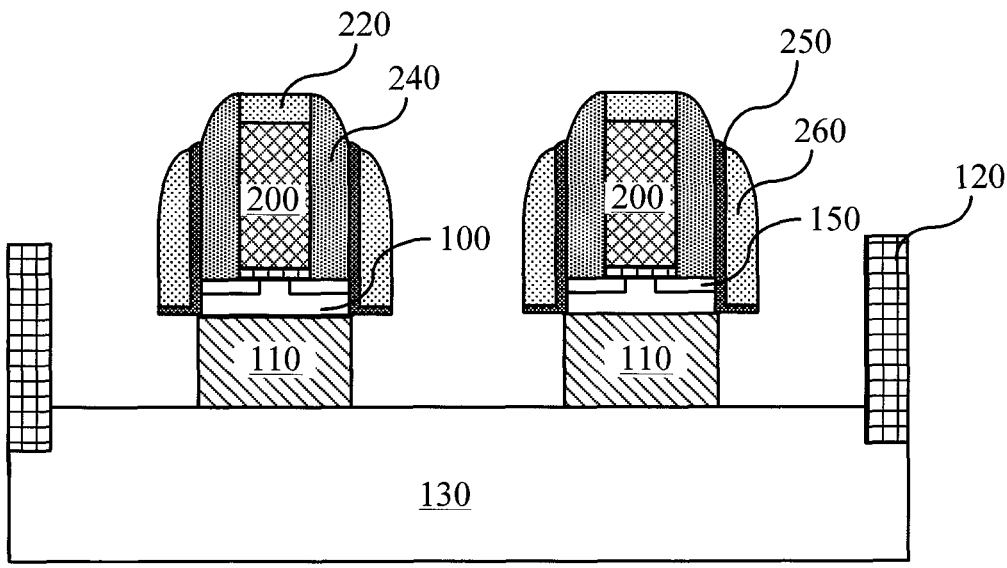

In particular, referring to FIG. 9, FIG. 9a and FIG. 9b, wherein FIG. 9a and FIG. 9b are schematic cross-sectional views of FIG. 9 taken along lines AA' and BB', respectively. As shown in the figures, the first semiconductor layer 110 below the gate stack and the second spacer 260 is etched back, so that the depth of the lateral etching is slightly greater than the sum of the thicknesses of the second spacer 260 and the stop layer 250 by controlling the etching time.

Figure 10:
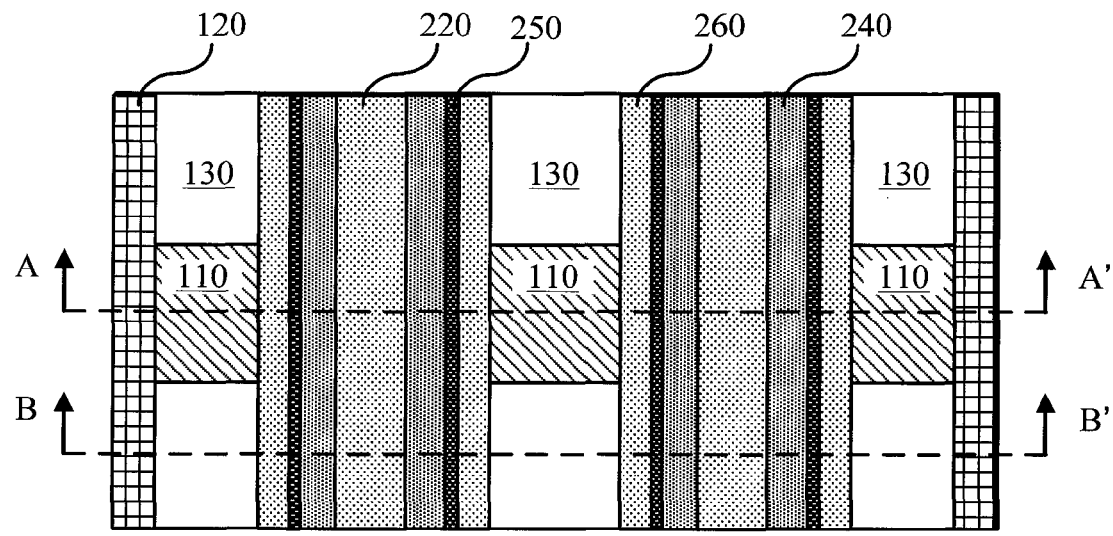
FIG. 10 is a schematic top view after forming the supporting isolated structure.
Figure 10A:
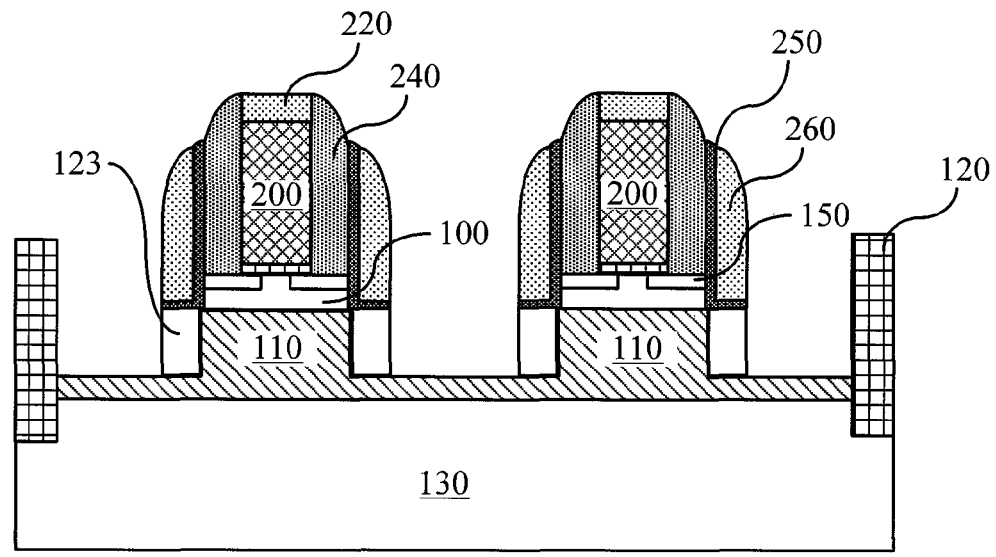
FIG. 10a and FIG. 10b are schematic cross-sectional views of FIG. 10 taken along lines AA' and BB', respectively.
Figure 10B:
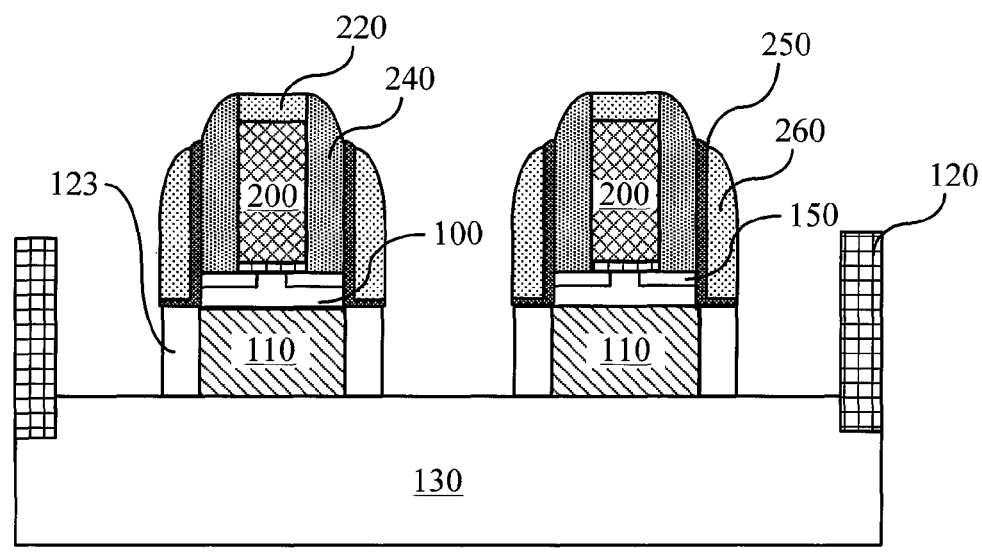

Next, referring to FIG. 10, FIG. 10a and FIG. 10b, wherein FIG. 10a and FIG. 10b are schematic cross-sectional views of FIG. 10 taken along lines AA' and BB', respectively. As shown in the figures, a third semiconductor layer (not shown) is formed on the exposed semiconductor surface by using a method such as epitaxial growth, and the third semiconductor layer exposed vertically is removed by an anisotropic etching process (for example, RIE, the etching is substantially vertical) while the third semiconductor layer below the first device stack having the second spacer 260 (mainly below the second spacer 260) is left to form a supporting isolated structure 123. The supporting isolated structure 123 is laterally approximately located below both sides of the second spacer 260 and the first device stack. In this embodiment, the material of the supporting isolated structure 123 is monocrystalline silicon, while the material of the supporting isolated structure 123 in other embodiments can be other materials different from the semiconductor material of the semiconductor layer 110. As shown in FIG. 10a, in the middle part of the semiconductor structure along the width direction, the first semiconductor layer 110 is not completely etched under the protection of the lithography mask 300 (referring to FIG. 8). Therefore, when the supporting isolated structure 123 is formed on the side surfaces of the first semiconductor layer 110 that are initially covered by the lithography mask 300, the supporting isolated structure 123 is formed on the first semiconductor layer 110, i.e., the first semiconductor layer 110 is formed between the supporting isolated structure 123 and the substrate 130. As shown in FIG. 11b, in the two end areas of the semiconductor structure along the width direction without the protection of the lithography mask 300, the etching stops before the surface of the substrate 130, and therefore the first semiconductor layer 110 is absent under the supporting isolated structure 123 formed, i.e., the supporting isolated structure 123 is directly formed on the substrate 130 and in contact with the substrate 130. Although the supporting isolated structure 123 formed in the two end areas of the semiconductor structure along the width direction is illustrated in this embodiment, it will be understood by the skilled person in the art that the specific position of the supporting isolated structure 123 is not limited to what is illustrated in this embodiment. For example, the skilled person in the art would understand that the supporting isolated structure 123 can be formed at any position of the semiconductor structure along the width direction, as long as it can be connected with the substrate to form a cavity and support the first device stack. The specific positions thereof will not be given in detail.

In Step S106, the remaining first semiconductor layer 110 is removed, and a cavity 112 is formed below the first device stack.

Figure 11:
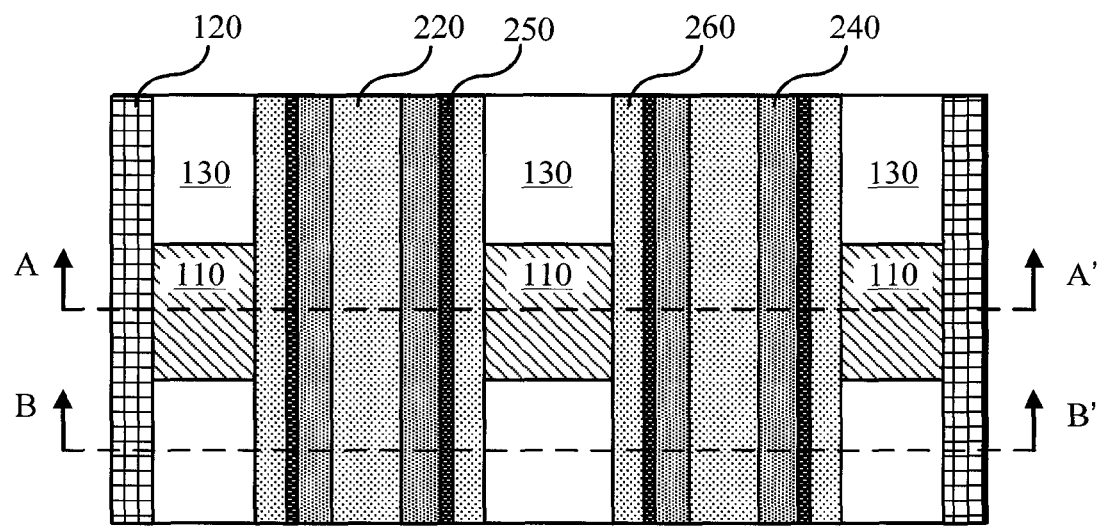
FIG. 11 is a schematic top view after removing the second semiconductor layer to form a cavity under the gate stack.
Figure 11A:
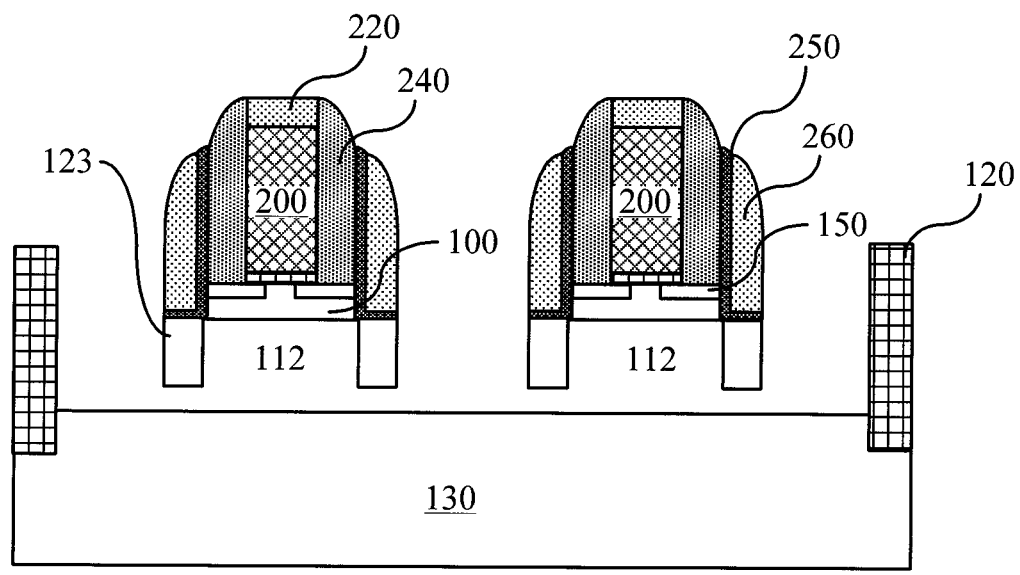
FIG. 11a and FIG. 11b are schematic cross-sectional views of FIG. 11 taken along lines AA' and BB', respectively.
Figure 11B:
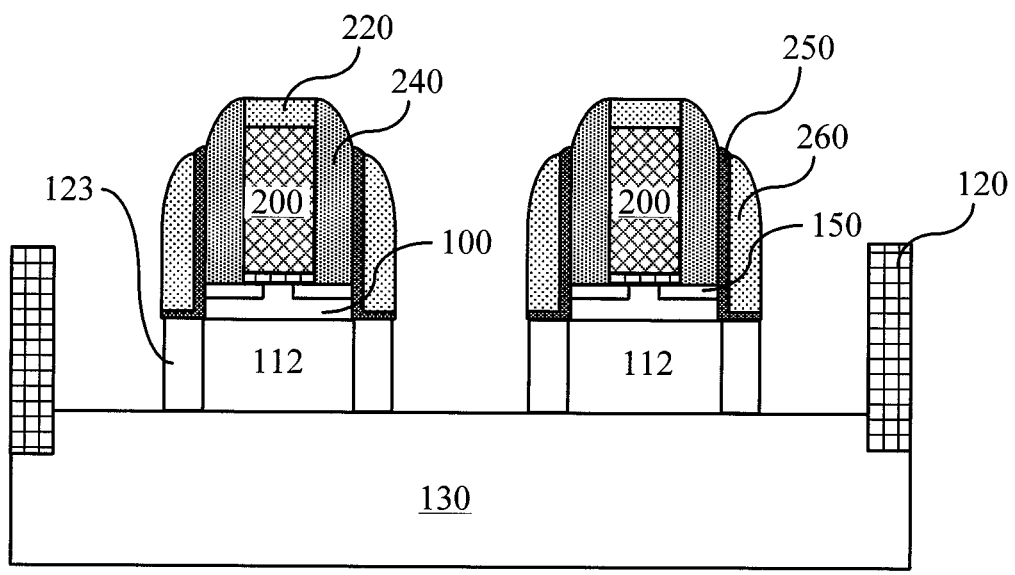

In particular, as shown in FIG. 11, FIG. 11a and FIG. 11b, FIG. 11a and FIG. 11b are schematic cross-sectional views of FIG. 11 taken along lines AA' and BB', respectively. As shown in the figures, the remaining first semiconductor layer 110 is selectively removed by using wet etching, and a cavity 112 is formed under the gate stack. As the material of the first semiconductor layer 110 is different from those of the substrate 130, the base area 101 and the supporting structure 123, only the remaining first semiconductor layer 110 can be removed through selection of appropriate etching solution. The etching solution first etches the first semiconductor layer 110 outside the supporting isolated structure 123, and then removes the first semiconductor layer 110 located between the supporting isolated structure 123 and the substrate 130. At this time, in the middle part of the semiconductor structure along the width direction, a gap is formed between the supporting isolated structure 123 and the substrate 130. The etching solution further etches the first semiconductor layer 110 below the gate stack through the gap, until the entire semiconductor layer 110 is completely removed to form a cavity 112 under the gate stack. At this time, as shown in FIG. 11a, as to the area in which the first semiconductor layer 110 is formed between the supporting isolated structure 123 and the substrate 130, a gap is formed between the supporting isolated structure 123 and the substrate 130 after removal of the first semiconductor layer 110. As shown in FIG. 11b, as to the area in which the first semiconductor layer 110 is absent between the supporting isolated structure 123 and the substrate 130, the supporting isolated structure 123 is connected with the substrate 130 to support the gate stack and the base area 101, so that the gate stack and the base area 101 can suspend above the substrate 130.

In Step S107, the second spacer 260 is removed, and both sides of the first device are filled with stressed materials to form a stressed material layer 113.

In particular, referring to FIG. 12, FIG. 12a and FIG. 12b, wherein FIG. 12a and FIG. 12b are schematic cross-sectional views of FIG. 12 taken along lines AA' and BB', respectively. As shown in the figures, the second spacer 260 is removed by dry etching with a stop layer 250 as the etch stop layer; then the stop layer 250 is further removed by dry etching with the first spacer 240 as the etch stop layer, so as to expose the first device stack. At this time, the first device stack is connected to the substrate 130 by the supporting isolated structure 123; then both sides of the first device stack are filled with stressed materials to form a stressed material layer 113, wherein the upper surface of the stressed material layer 113 is higher than the bottom of the gate stack or at the same lever with the bottom of the gate stack. Due to the existence of the supporting isolated structure 123, the stressed material is formed substantially outside the supporting isolated material 123 so that the cavity 112 is not filled. As shown in FIG. 12a, the supporting isolated structure 123 is not directly in contact with the area of the substrate 130 in that a gap is formed between the supporting isolated material 123 and the substrate 130, and thereby a small amount of stressed material may enter into the cavity 112 through the gap. However, the small amount of stressed material accumulates to form a barrier after entering the gap, so that only this part of the stressed material enters into the cavity 112 while most of the stressed material is isolated from outside. As shown in FIG. 12b, in the connection area between the supporting isolated 123 and the substrate 130, the stressed material is completely obstructed outside the cavity 112 by the supporting isolated structure 123.

The process for forming the stressed material layer 113 is preferably epitaxial growth. In the case of a PFET device, the material of the stressed material layer 113 is boron-doped $Si_{1-x}Ge_x$ with the value of X in the range of 0.1 to 0.7, such as 0.2, 0.3, 0.4, 0.5 or 0.6; and in the case of an NFET device, the material of the stressed material layer 113 is phosphorus- or arsenicum-doped Si:C with the atom percentage of C in the range of 0.2% to 2%, such as 0.5%, 1% or 1.5%. The existence of the stressed material layer 113 contributes to a further adjustment of the stress in the channel region, so that the carrier mobility in the channel region can be increased. A PFET device is provided with N-type super-steep retrograde well structure after filling with a doped stressed material, while an NFET device is provided with a P-type super-steep retrograde well structure after filling with a doped stressed material.

The present invention will have the following advantages over the prior art. The channel with less thickness and the cavity formed between the channel and the substrate would be beneficial to the inhibition of the short channel effect, the reduction of the parasitic capacitance, the reduction of the leakage current and the enhancement of the steepness of the source/drain region. In addition, as the cavity is arranged below the channel, the stress of the stressed material layer on both sides of the channel will maximize the effect on the channel, so that the influence of the stress on the channel carrier mobility can be effectively improved, the control of the channel performance can be enhanced, and thereby the inhibition and the control of the short channel effect can be better realized.

Although the exemplified embodiments and the advantages thereof have been illustrated in detail, it is understood that any modification, replacement and change can be made to these embodiments without departing from the spirit of the invention and the scope defined in the attaching claims. As to other examples, a skilled technician in the art can easily understand that the order of the process steps can be modified without falling outside the protection scope of the invention.

In addition, the application fields of the invention is limited to the process, mechanism, fabrication, material compositions, means, methods and/or steps in the particular embodiments as given in the description. From the disclosure of the invention, a skilled technician in the art can easily understand that, as for the process, mechanism, fabrication, material compositions, means, methods and/or steps at present or to be developed, which are carried out to realize substantially the same function or obtain substantially the same effects as the corresponding examples described according to the invention do, such process, mechanism, fabrication, material compositions, means, methods and/or steps can be applied according to the invention. Therefore, the claims attached to the invention are intended to encompass the process, mechanism, fabrication, material compositions, means, methods and/or steps into the protection scope thereof.

We claim:

1. A method for manufacturing a semiconductor structure, comprising:
    a) providing a substrate, forming a first semiconductor layer on the substrate, forming a second semiconductor layer on the first semiconductor layer and forming a gate stack on the second semiconductor layer;
    b) removing the second semiconductor on both sides of the gate stack to form a first device stack;
    c) forming a spacer on both sides of the first device stack, and removing part of the first semiconductor layer on both sides of the first device stack with a certain thickness of the first semiconductor layer left;
    d) in a partial area of the first device stack along the width direction, removing the first semiconductor layer located on both sides of the first device stack to expose the substrate;
    e) in the partial area of the first device stack along the width direction, forming a supporting isolated structure connected to the substrate under the spacer and under an edge on both sides of the first device stack;
    f) removing the remaining first semiconductor layer to form a cavity under the first device stack; and
    g) removing the spacer and filling both sides of the first device stack with stressed materials to form a stressed material layer.

2. The method according to claim 1, wherein the partial area of the first device stack along the width direction comprises two end areas of the first device stack along the width direction.

3. The method according to claim 2, wherein the second semiconductor layer has a thickness in a range between 10 nm and 30 nm.

4. The method according to claim 2, wherein the step b) comprises:
    etching the second semiconductor layer with the gate stack used as a mask and the first semiconductor layer used as a etch stop layer to form a first base area under the gate stack which, together with the first base area, constitutes the first device stack.

5. The method according to claim 1, wherein:
    the material of the first semiconductor layer is different from that of the substrate and that of the second semiconductor layer.

6. The method according to claim 5, wherein the second semiconductor layer has a thickness in a range between 10 nm and 30 nm.

7. The method according to claim 5, wherein the step b) comprises:
    etching the second semiconductor layer with the gate stack used as a mask and the first semiconductor layer used as a etch stop layer to form a first base area under the gate stack which, together with the first base area, constitutes the first device stack.

8. The method according to claim 1, wherein the second semiconductor layer has a thickness in a range between 10 nm and 30 nm.

9. The method according to claim 1, wherein the step b) comprises:
    etching the second semiconductor layer with the gate stack used as a mask and the first semiconductor layer used as a etch stop layer to form a first base area under the gate stack which, together with the first base area, constitutes the first device stack.

10. The method according to claim 9, wherein the step c) comprises:
    forming a stop layer on both sides of the first device stack and forming the spacer on both sides of the stop layer; and
    etching the first semiconductor layer located on both sides of the spacer with the first device stack having the spacer used as a mask to remove part of the first semiconductor layer.

11. The method according to claim 10, wherein the step d) comprises:
    forming a lithography mask on the semiconductor structure to cover a partial area of the first device stack along the width direction;
    etching the first semiconductor layer with the lithography mask and the first device stack having the spacer used as a mask to expose the substrate; and
    removing the lithography mask.

12. The method according to claim 11, wherein the step e) comprises:
    etching back the first semiconductor layer located under the gate stack, wherein the depth of the lateral etching is greater than the total thickness of the spacer and the stop layer;
    forming a third semiconductor layer on the upper surface and the side surfaces of the first semiconductor layer by epitaxial growth; and
    removing the third semiconductor layer located on the upper surface of the first semiconductor layer by anisotropic etching to form a supporting isolated structure.

13. The method according to claim 1, wherein:
    the level of the upper surface of the stressed material layer is higher than or equal to that of the bottom of the gate stack.

14. A semiconductor structure comprising a substrate, a gate stack, a base area and a source/drain region, wherein the gate stack is located on the base area, the source/drain region is located in the base area, and the base area is located on the substrate, characterized in that:
    a supporting isolated structure is provided between the base area and the substrate, wherein part of the supporting structure is connected to the substrate;
    a cavity is provided between the base area and the substrate, wherein the cavity is composed of the base area, the substrate and the supporting isolated structure; and
    a stressed material layer is provided on both sides of the gate stack, the base area and the supporting isolated structure.

15. The semiconductor structure according to claim 14, wherein the base area has a thickness in the range between 10 nm and 30 nm.

16. The semiconductor structure according to claim 15, wherein:
    the upper surface of the stressed material layer is higher than or at the same level with the bottom of the gate stack.

17. The semiconductor structure according to claim 14, wherein:

the upper surface of the stressed material layer is higher than or at the same level with the bottom of the gate stack.

\* \* \* \* \*